US008124444B2

(12) United States Patent
Kloc et al.

(10) Patent No.: US 8,124,444 B2
(45) Date of Patent: Feb. 28, 2012

(54) METHOD OF DOPING ORGANIC SEMICONDUCTORS

(75) Inventors: Christian Leo Kloc, Constance (DE); Arthur Penn Ramirez, Summit, NJ (US); Woo-Young So, New Providence, NJ (US)

(73) Assignees: Alcatel Lucent, Paris (FR); The Trustees of Columbia University, New York, NY (US)

( * ) Notice: Subject to any disclaimer, the term of this patent is extended or adjusted under 35 U.S.C. 154(b) by 0 days.

(21) Appl. No.: 12/875,902

(22) Filed: Sep. 3, 2010

(65) Prior Publication Data

US 2010/0330737 A1   Dec. 30, 2010

Related U.S. Application Data

(63) Continuation of application No. 12/024,484, filed on Feb. 1, 2008, now Pat. No. 7,821,000.

(51) Int. Cl.
*H01L 51/30* (2006.01)
*H01L 21/00* (2006.01)

(52) U.S. Cl. ............. 438/99; 257/40; 257/E21.001; 257/E51.006

(58) Field of Classification Search ............ 257/40, 257/E51.001, E21.001; 438/99
See application file for complete search history.

(56) References Cited

U.S. PATENT DOCUMENTS

| | | | |
|---|---|---|---|
| 5,574,291 A | 11/1996 | Dodabalapur et al. |
| 5,596,208 A | 1/1997 | Dodabalapur et al. |
| 5,625,199 A | 4/1997 | Baumbach et al. |
| 6,150,668 A | 11/2000 | Bao et al. |
| 6,197,663 B1 | 3/2001 | Chandross et al. |
| 6,278,127 B1 | 8/2001 | Dodabalapur et al. |
| 6,575,013 B2 | 6/2003 | Beo et al. |
| 6,661,299 B2 | 12/2003 | Dodabalapur et al. |
| 6,870,180 B2 | 3/2005 | Dodabalapur et al. |
| 2004/0126935 A1 | 7/2004 | Zhang et al. |
| 2004/0197944 A1 | 10/2004 | Chen et al. |
| 2005/0139823 A1 | 6/2005 | Hirakata et al. |
| 2005/0168801 A1 | 8/2005 | O'Neil et al. |
| 2006/0289859 A1 | 12/2006 | Yoneya |
| 2007/0023748 A1 | 2/2007 | Vogel et al. |
| 2007/0131926 A1* | 6/2007 | Lee et al. ............... 257/40 |
| 2007/0145361 A1* | 6/2007 | Aramaki et al. ......... 257/40 |
| 2007/0215863 A1 | 9/2007 | Kloc et al. |
| 2009/0194762 A1 | 8/2009 | Kloc et al. |

OTHER PUBLICATIONS

Chynoweth, A.G.; The Effect of Oxygen on the Photoconductivity of Anthracene. II*; The Journal of Chemical Physics, vol. 22, No. 6, Jun. 1954; pp. 1029-1032.

Li, Dawen, et al.; "Humidity Effect on Electrical Performance of Organic Thin Film Transistors"; Applied Physics Letters 86, 042105 (2005); pp. 042105-1-042105-3.

(Continued)

*Primary Examiner* — Victor A Mandala
*Assistant Examiner* — Whitney T Moore
(74) *Attorney, Agent, or Firm* — Hitt Gaines, PC

(57) ABSTRACT

A method includes the steps of forming a contiguous semiconducting region and heating the region. The semiconducting region includes polyaromatic molecules. The heating raises the semiconducting region to a temperature above room temperature. The heating is performed in the presence of a dopant gas and the absence of light to form a doped organic semiconducting region.

17 Claims, 10 Drawing Sheets

OTHER PUBLICATIONS

Nibbering, E.T., et al.; "Determination of the inertial Contribution to the Nonlinear Refractive Index of Air, N2, and O2 by Use of Unfocused High-Intensity Femtosecond Laser Pulses";; J. Optical Society of America B, vol. 14, No. 3, Mar. 1997; pp. 650-660.

Podzorov, V., et al.; "Field-Effect Transistors on Rubrene Single Crystals With Parylene Gate Insulator"; Applied Physics Letters, vol. 82, No. 11, Mar. 17, 2003; pp. 1739-1741.

Podzorov, V., et al.; "Light-Induced Switching in Back-Gated Organic Transistors With Build-In Conduction Channel"; Applied Physics Letters, vol. 85, No. 24, Dec. 13, 2004; pp. 6039-6041.

Schon, J.H.; "New Phenomena in High Mobility Organic Semiconductors"; Phys. Stat. Sol. (b), 226, No. 2, 2001; pp. 257-270.

Woo-Young So, et al., "Mobility-Independent Coping in Crystalline Rubrene Field-Effect Transistors", Solid State Communications, 2007, pp. 483-486.

\* cited by examiner

METHOD OF DOPING ORGANIC SEMICONDUCTORS

CROSS-REFERENCE TO RELATED APPLICATIONS

This Application is a Continuation of U.S. application Ser. No. 12/024,484 filed on Feb. 1, 2008 now U.S. Pat. No. 7,821,000, to Kloc, et al. entitled "Method of Doping Organic Semiconductors", currently allowed, commonly assigned with the present invention and incorporated herein by reference in its entirety. The present application is related to U.S. patent application Ser. No. 11/375,833 to Kloc, et al. entitled "Fabricating Apparatus with Doped Organic Semiconductors", which is commonly assigned with the present application and hereby incorporated by reference as if reproduced herein in its entirety.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of contract No. DE-FG02-04ER46118 awarded by the Department of Energy.

TECHNICAL FIELD OF THE INVENTION

The present invention is directed, in general, to organic semiconductors.

BACKGROUND OF THE INVENTION

Organic semiconductors are the subject of intense research interest. Potential benefits of these materials include low-cost, wide area coverage, and use with flexible electronic devices. They have been employed in organic light-emitting diodes (oLEDs) and organic field-effect transistors (oFETs), and in circuits integrating multiple devices. Fabrication techniques such as ink-jet printing have helped reduce the cost of fabrication of these devices and integrated circuits using them.

SUMMARY OF THE INVENTION

One embodiment is a method that includes forming a contiguous semiconducting region that includes polyaromatic molecules. The method further includes heating the region to a temperature above room temperature in the presence of a dopant gas and the absence of light to form a doped organic semiconducting region.

Another embodiment is a method that includes forming an organic semiconducting region that includes a crystalline region of polyaromatic molecules. A dielectric layer is formed over the organic semiconducting region. The method further includes forming an opening in the dielectric layer to expose the organic semiconducting region. The organic semiconducting region is then heated to a temperature above room temperature in the absence of light.

Another embodiment is a method that includes forming a crystalline organic semiconducting region that includes polyaromatic molecules. A source electrode and a drain electrode are placed in contact with the organic semiconducting region. A gate electrode is located to affect the conductivity of the organic semiconducting region between the source and drain electrodes. The method further includes forming a dielectric layer of a first dielectric between the organic semiconducting region and the gate electrode. The dielectric layer is substantially impermeable to oxygen and in contact with the organic semiconducting region. An opening is formed in the first dielectric to form a doping channel, wherein a portion of the organic semiconducting region is in contact with a second dielectric via the opening. A physical interface is located between the second dielectric and the first dielectric.

BRIEF DESCRIPTION OF THE DRAWINGS

Various embodiments are understood from the following detailed description, when read with the accompanying figures. Various features may not be drawn to scale and may be arbitrarily increased or reduced in size for clarity of discussion. Reference is now made to the following descriptions taken in conjunction with the accompanying drawings, in which.

DETAILED DESCRIPTION OF ILLUSTRATIVE EMBODIMENTS

Some polyaromatic semiconductors have been found to have relatively poor stability of electrical properties in the presence of some gases. Oxygen, e.g., can react with a portion of the polyaromatic molecule, thereby altering the electronic properties of the molecule. Such instability may be regarded as undesirable in many circumstances.

Some of the embodiments recognize the unexpected benefits of increasing the conductivity of a semiconducting polyaromatic layer by exposure to a dopant gas while heating and excluding light. In some embodiments, the increase of conductivity is substantially due to an increase of carrier concentration without a significant change of mobility of the carriers. Some embodiments stabilize the conductivity of the layer by subsequent exclusion of light and/or further exposure to the dopant gas from the layer using, e.g., a barrier layer or a package.

Figure 1A:
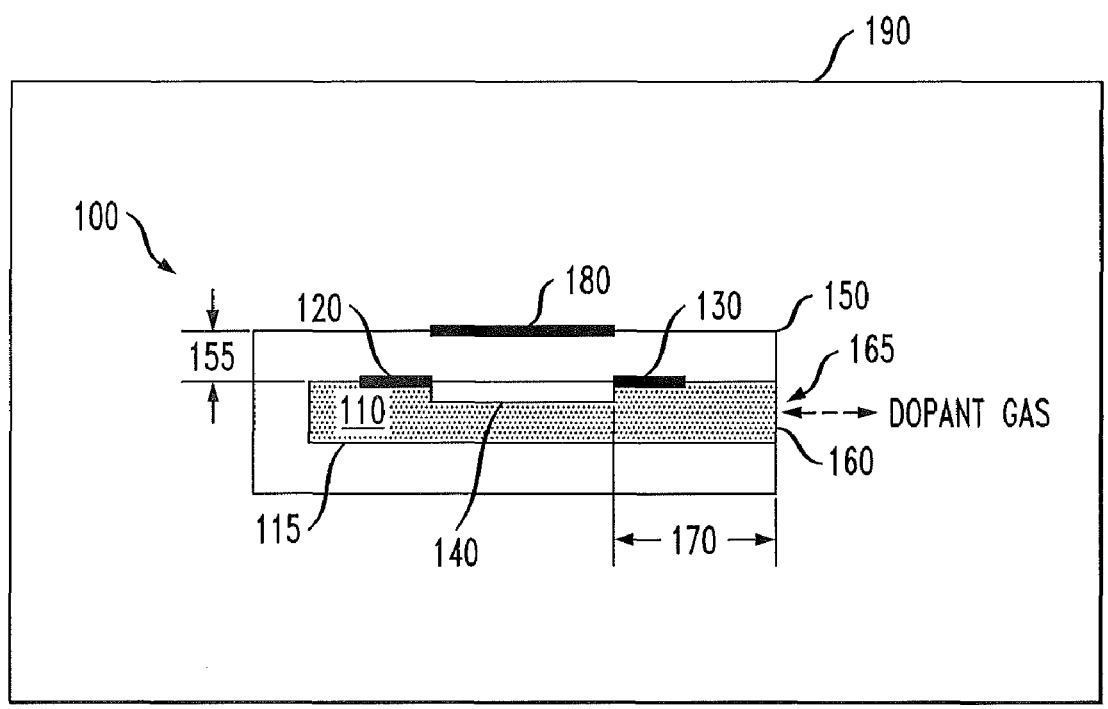
FIGS. 1A-1D illustrate an embodiments of a FET.

FIG. 1A illustrates a cross-sectional view of an embodiment of an organic field effect transistor (FET) 100. The FET 100 includes a channel material 110 having a surface 115. A source electrode 120 and a drain electrode 130 are in contact with the channel material 110, and a channel region 140 is shown as a contiguous portion of the channel material 110 between the source/drain electrodes 120, 130. A dielectric layer 150 with a thickness 155 substantially encapsulates the surface 115 of the channel material 110, with a portion 160 of the channel material 110 exposed to the ambient by virtue of an opening in the dielectric layer 150 that forms a doping channel 165. In the illustrated embodiment, the channel material 110 is self-supporting. In such embodiments, the FET 100 may optionally be affixed to a substrate. In some embodiments, the doping channel 165 may be formed, e.g., by cleaving the channel material 110. The channel region 140 is a distance 170 from the doping channel 165. As discussed further below, in some embodiments the dielectric layer 150 is impermeable to a dopant gas used to dope the channel material 110. A gate electrode 180 is formed over the dielectric layer 150 between the source/drain electrodes 120, 130.

Exposure to the dopant gas increases the majority charge carrier density in the channel material 110 of the organic semiconductor as described herein. It is believed by the inventors that when incorporated into the organic semiconductor, the dopant gas operates to transfer mobile charges to the organic semiconductor, thereby creating charge traps. In some cases, the dopant gas molecules may form covalent bonds with the organic semiconductor. In other cases, the dopant gas molecules may occupy interstitial sites in the organic semiconductor without covalently bonding thereto. Depending on the gas molecule and the organic semiconductor, the charge traps may be positive or negative ions. The exposure to the dopant gas may increase the majority charge carrier density while leaving the mobility of the charge carriers substantially unchanged. As used herein with respect to the charge carrier mobility, substantially unchanged means that the mobility changes less than about 10%. In some cases of substantially unchanged mobility, the mobility may decrease, e.g., by less than 5% or by less than 1%.

In some cases, the dopant gas comprises oxygen. In such cases, the gas may be, e.g., a homoatomic source of oxygen, such as $O_2$ or $O_3$, or a heteroatomic source such as $H_2O$ or $N_2O$. In other cases, the dopant gas may comprise a halogen, e.g., F, Cl, I or Br. Doping by the dopant gas may be reversible by non-chemical means, e.g., by exposing the doped channel material 110 to elevated temperature. Such exposure may reverse doping by, e.g., causing outgassing of the dopant gas by the doped organic semiconductor. In some cases, doping may be reversed by exposing the doped organic semiconductor to a reducing gas, e.g., $H_2$.

The term impermeable as used herein with respect to a dielectric layer or barrier means that the rate of diffusion of the dopant gas through the layer barrier is below a rate that results in a significant change of semiconducting characteristics of the channel region 140 over the operational lifetime of a device employing the channel material 110. In some cases, an operational lifetime of such a device is about 10 years. A significant change as used with respect to semiconducting characteristics is a change that causes the device, such as a FET, to operate outside its operational specifications. Such a change may be, e.g., a 5% change of conductance at a given gate voltage $V_{gs}$ from the conductance at a given threshold voltage immediately after manufacture.

The channel material 110 is referred to as "exposed" when the portion 160 forms an interface with a second dielectric. The second dielectric may be, e.g., the surrounding ambient or another layer of a solid dielectric material. In the latter case, the solid dielectric material may be the same or a different material as the dielectric layer 150.

The FET 100 may be a component of an apparatus 190. The apparatus 190 may additionally include other electronic devices, such as resistors, capacitors and transistors, and a power source to operate the FET 100. The FET 100 may optionally be configured to electrically behave primarily as, e.g. a transistor, resistor, capacitor, or LED.

Figure 1B:
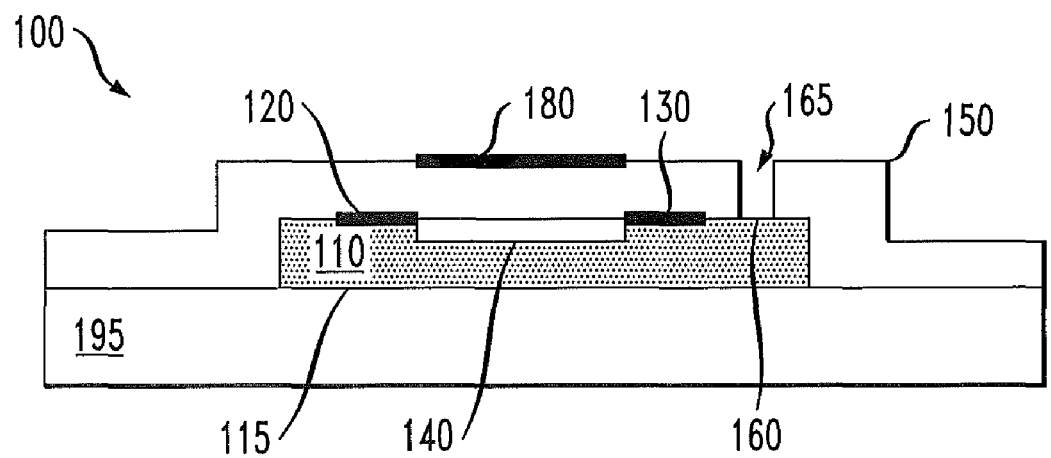

FIG. 1B illustrates an embodiment of the FET 100 in which the channel material 110 is in contact with a substrate 195. The dielectric layer 150 is formed over the channel material 110 and the substrate 195. When the dielectric layer 150 is impermeable to the dopant gas, the substrate 195 is preferably at least as impermeable to the dopant gas as is the dielectric layer 150. Substrate materials such as glass, silicon and some polymers are sufficiently impermeable to most gases and may also provide mechanical support to the channel material 110. In the illustrated embodiment, the doping channel 165 may be formed, e.g., by a plasma etch process designed to remove the dielectric layer 150. Such a process may optionally be designed to stop on the channel material 110, as shown. The source electrode 120 and the drain electrode 130 are formed on the channel material 110, and thus lie between the dielectric layer 150 and the channel material 110.

Figure 1C:
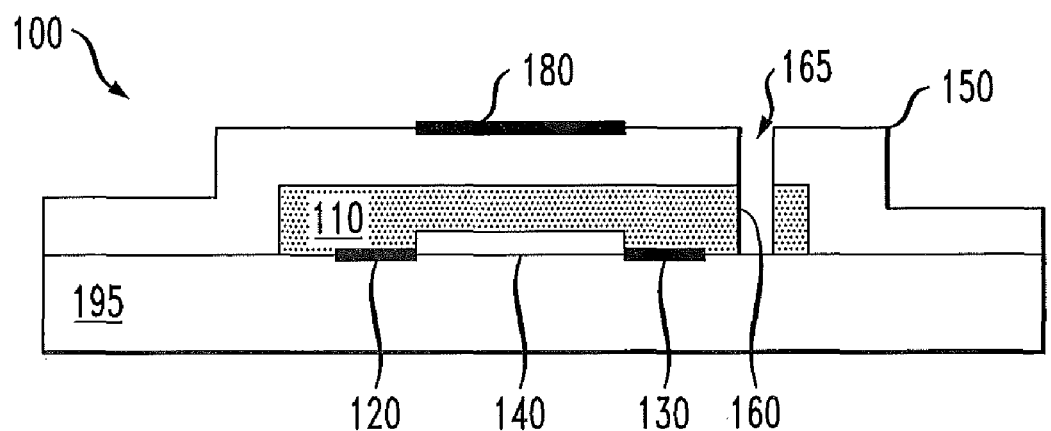

FIG. 1C illustrates an embodiment in which the source electrode 120 and the drain electrode 130 are formed on the substrate 195. The channel material 110 is formed over the source/drain electrodes 120, 130 and the dielectric layer 150 is formed thereover. The doping channel 165 may again be formed by a plasma etch process. In this case, the etch process may be designed to remove the dielectric layer 150 and the channel material 110 to form the doping channel 165. In the illustrated embodiment, the exposed portion 160 includes a larger surface area of the channel material 110 than does the embodiment of FIG. 1B. Thus, the configuration of FIG. 1O may provide more rapid doping of the channel material 110 with the dopant gas than the configuration of FIG. 1B.

Figure 1D:
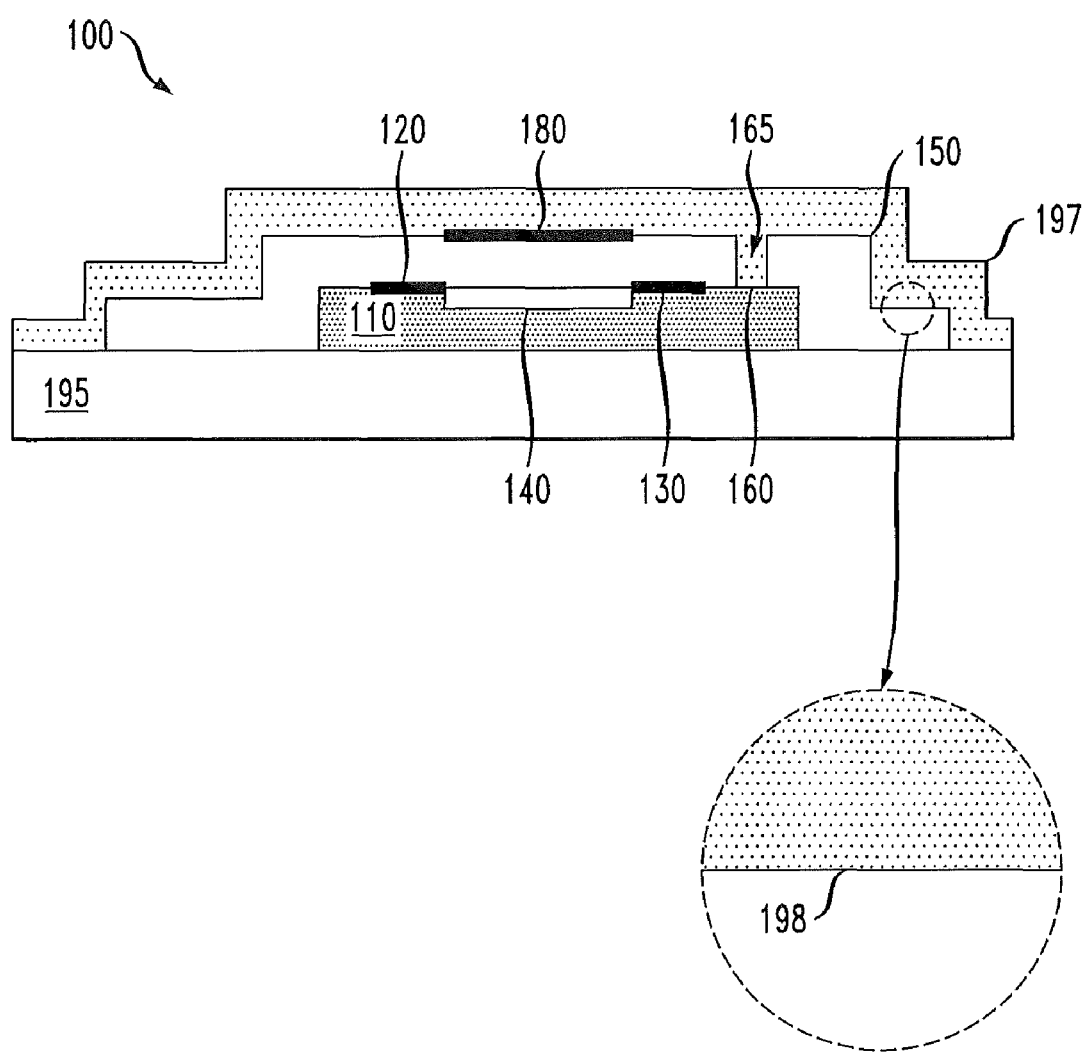

FIG. 1D illustrates an embodiment in which an optional capping layer 197 is formed over the dielectric layer 150 and the doping channel 165. The capping layer 197 may serve to prevent exposure of the channel material 110 to the doping gas after doping the channel material 110 as described below. The capping layer 197 may also have other characteristics that are desirable in some circumstances. For example, the capping layer 197 may be chosen to exclude light from the channel material 110 that is capable of forming or breaking molecular bonds or causing molecular excitations therein.

The capping layer 197 may be the same or a different material from the dielectric layer 150. The choice of material for the capping layer 197 may be influenced by, e.g., the ability to fill the doping channel 165, opacity at a wavelength of interest, and barrier properties. Regardless of whether the dielectric layer 150 and the capping layer 197 are the same or a different material, an interface 198 is formed between the dielectric layer 150 and the capping layer 197. When the dielectric layer 150 and the capping layer 197 are the same material, the interface 198 may be detected, e.g., by electron microscopy. In some cases, the function of the capping layer may be provided by a package that excludes light and the doping gas, e.g., oxygen.

The channel material 110 includes a crystalline or polycrystalline organic semiconductor, which may be a p-type or an n-type semiconducting material. For a p-type material, e.g., when a voltage $V_{gs}$ of the gate electrode 180 with respect to the source electrode 120 is at or below a threshold voltage, $V_{th}$, of the FET 100, the channel region 140 becomes more conductive, and current may flow between the source electrode 120 and the drain electrode 130. The $V_{th}$ depends on the dielectric permittivity of the dielectric layer 150 and the dielectric thickness 155. While not limiting the scope of the invention by theory, in the case of p-type organic semiconductors it is believed that below $V_{th}$, a charge trap, e.g., an electron trap state or an acceptor state, localizes thermally activated electrons from the valence band, and remaining delocalized holes produce p-type semiconducting properties of the channel material 110.

The channel material 110 is either a single crystal of polyaromatic molecules or a polycrystalline layer of the molecules. The polyaromatic molecules can be members of two broad classes. The first of these classes includes monodisperse compounds incorporating a plurality of aromatic or heteroaromatic units, where the units may be fused to each other and/or linked to each other in a way that maintains conjugation of π-bonds. Conjugated π-bonds provide for delocalization of electrons in the polyaromatic molecules.

The second class includes polymers and oligomers having the aforementioned polyaromatic characteristics. Herein, oligomers are polymer chains with less than about 10 repeating units. The polyaromatic molecules in these classes are typically characterized by having p-type semiconducting properties in the solid phase. Numerous such molecules are known in the art. For example, such molecules include acenes, thiophenes, di-anhydrides, di-imides, phthalocyanine salts, and derivatives of these classes of molecules.

Acenes are polyaromatic compounds having fused phenyl rings in a rectilinear arrangement, e.g., three or more such fused rings. A subclass of acenes includes those in which the aromatic rings are arranged in a linear fashion, as shown below. Among the linear acenes investigated for semiconducting applications are tetracene (n=2) and pentacene (n=3).

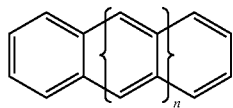

Thiophenes are molecules that have a five-member ring containing sulphur. Thiophenes having p-type semiconducting characteristics include those having one or more fused phenyl rings arranged in a linear fashion, with a terminal fused thiophene ring. A general structural representation of thiophenes having two terminal thiophene rings is shown below, for which n=0, 1, 2 . . . .

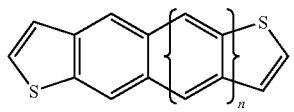

Figure 2:
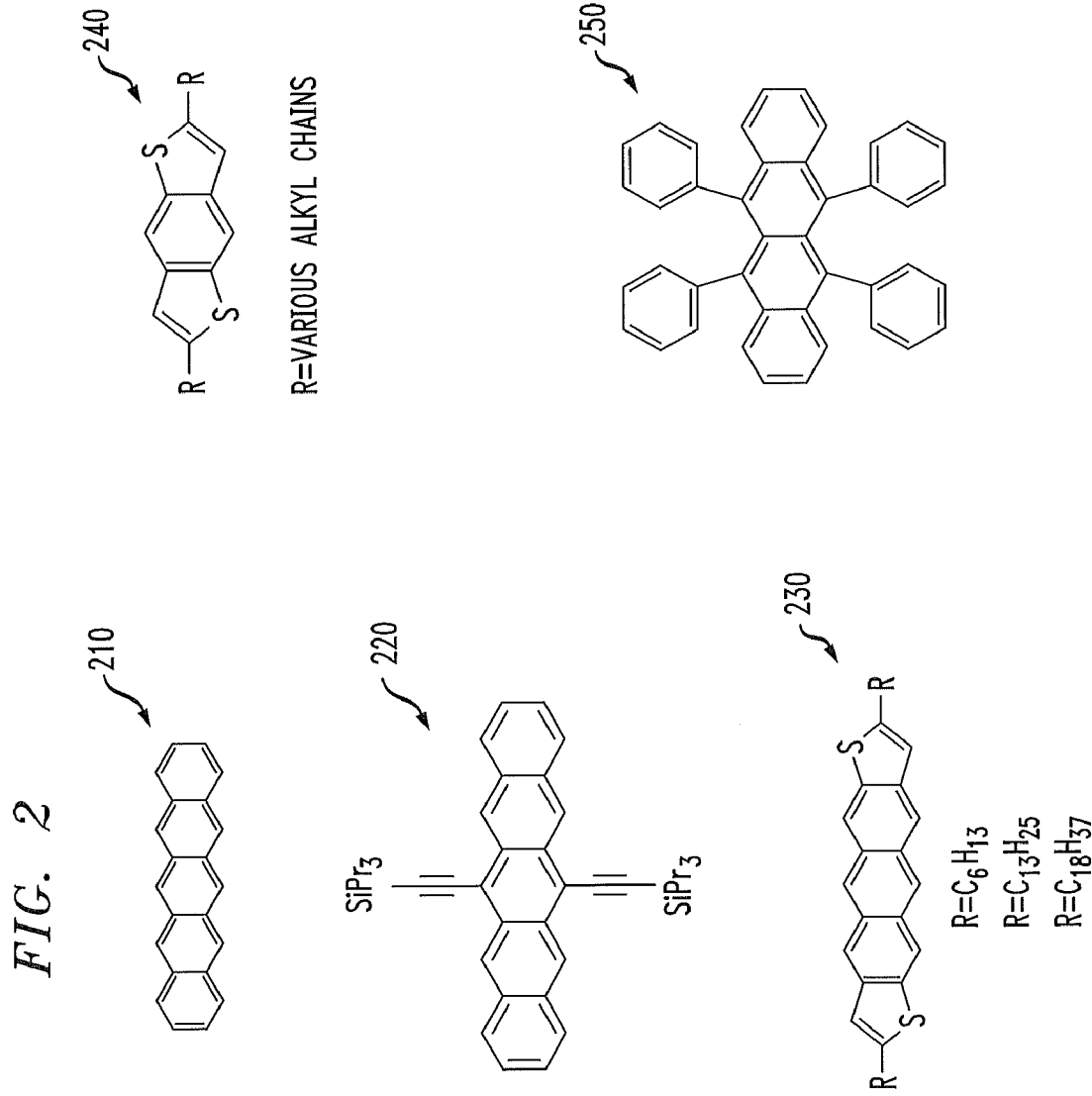
FIGS. 2 and 3 illustrate organic semiconducting molecules.

FIG. 2 shows examples of polyaromatic molecules with semiconducting properties that can be used as the channel material 110. These examples include: pentacene 210 and processable derivatives thereof such as 6,13-bis (triisopropyl-silylethynyl) pentacene (TIPS) 220; processable derivatives of anthradithiophene 230 and benzodithiophene 240; 5,6,11,12-tetraphenylnaphthacene (rubrene) 250 and processable derivatives thereof; naphthalene-1,4,5,8-tetracarboxyl di-anhydride 260; and derivatives 270 of N-substituted naphthalene-1,4,5,8-tetracarboxylic di-imide.

Figure 3:
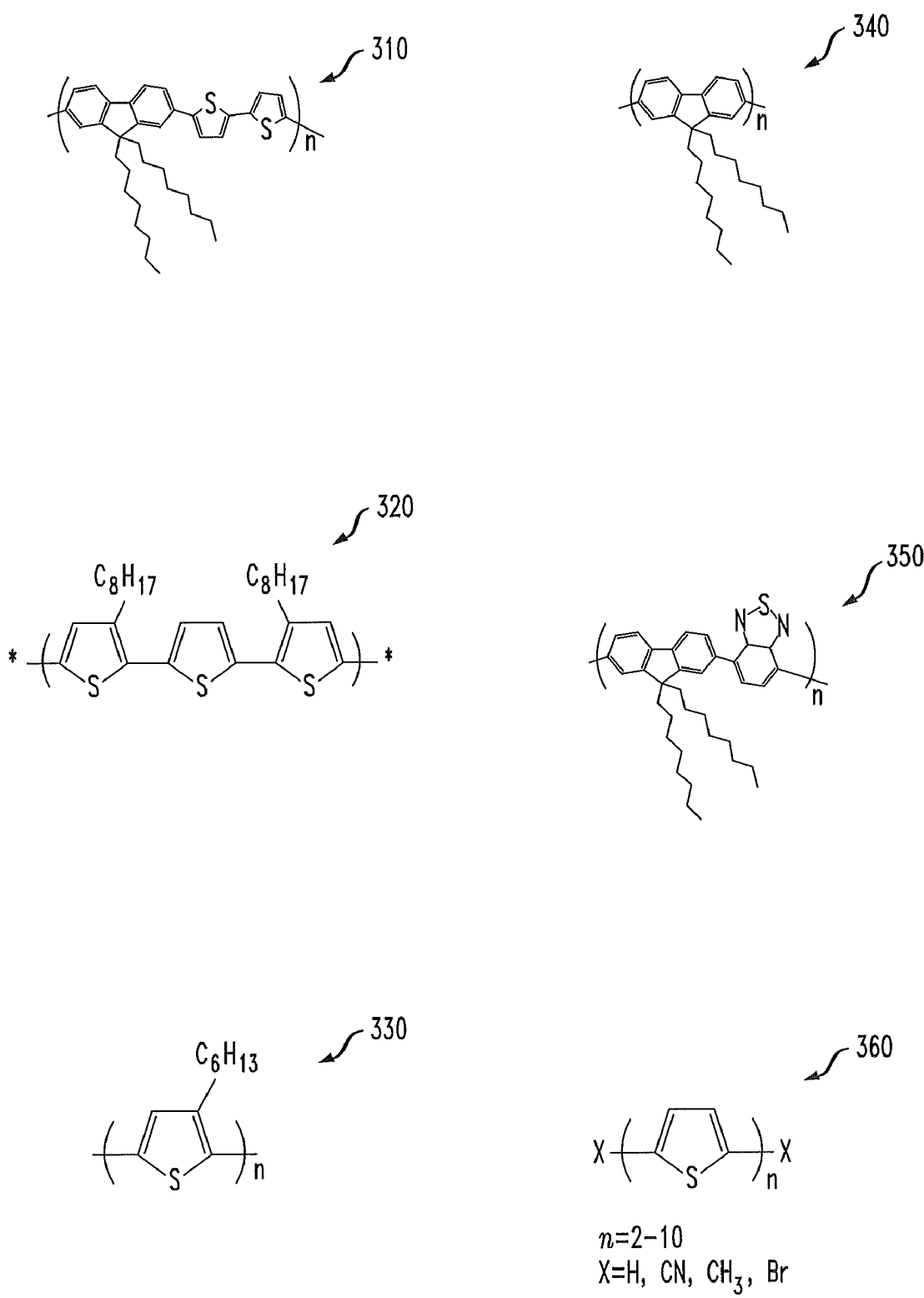

FIG. 3 shows examples of polyaromatic oligomers and polymers that can be used as the channel material 110. The examples include: poly(9,9-dioctylfluorene-alt-bithiophene (F8T2) 310; poly (3,3'-dioctylterthiophene) (PTT8) 320; regioregular poly(3-hexylthiophene) (P3HT) 330; poly(9,9-dioctylfluorene) (F8) 340; poly(9,9-dioctylfluorene-alt-benzothiadiazole) (F8BT) 350; and oligomeric polyaromatic molecule oligothiophene 360, and derivatives thereof. Those skilled in the pertinent art will appreciate that the above examples of polyaromatic molecules are not exhaustive of such molecules.

Additional details regarding semiconducting polymers and applications to FETs may be found in U.S. patent application Ser. No. 11/375,833 to Kloc, et al., previously incorporated by reference.

Crystals and films of semiconducting organic molecules do not typically have a significant population of electrons and holes in equilibrium in the absence of an applied electric field. Hence, the conductivity of such molecules is generally low relative to inorganic semiconductors. For example, while intrinsic silicon has a conductivity of about $1.5\text{E-}5\ \Omega^{-1}\text{cm}^{-1}$, intrinsic pentacene may have a conductivity of about $1.8\text{E-}8\ \Omega^{-1}\text{cm}^{-1}$ and intrinsic rubrene may have a conductivity of about $1\text{E-}9\ \Omega^{-1}\text{cm}^{-1}$.

However, exposure of some organic semiconductor films to a dopant gas can change the conductivity and mobility of charge carriers in the films. In many cases, these changes are detrimental to the purpose for which the film is used. Such exposure may be advantageous, however, if done in a controlled manner as described herein to produce stable semiconducting characteristics.

Embodiments disclosed herein benefit from the recognition that an organic semiconductor can be doped with a dopant gas in a manner that results in a substantially stable mobility of charge carriers. Previously known doping methods generally result in a substantial decrease of the mobility of the charge carriers. Without limitation by theory, it is thought that the decrease of mobility in prior art doping methods results from formation of deep charge traps. It is further thought that the embodiments described herein result in shallower charge traps that reduce hole mobility to a lesser degree. When the mobility is constant, or nearly so, a change of conductivity is about proportional to a change of the carrier concentration. Thus, the ability to change carrier concentration without substantially changing mobility, heretofore unknown, simplifies the task of designing circuits using such FETs, and provides the designer with more predictable operational characteristics of the FET.

In an embodiment, energy for the doping reaction is provided by raising the temperature of the organic semiconductor above room temperature (e.g., about 25° C.). The minimum reaction temperature will, in general, be related to the dopant gas and the organic semiconductor, as different dopant gases and materials will in general have different activation energies associated with forming charge traps therein by their interaction. A maximum doping temperature will in general be related to the onset of decomposition, or nonuniform or irreversible reactions between the dopant gas and the organic semiconductor. In one embodiment, in which $O_2$ is the dopant gas and the organic semiconductor is rubrene, the doping reaction may be performed at a temperature ranging from about 90° C. to about 150° C. In some cases, the doping reaction may be performed in a narrower temperature range of about 105° C. to about 115° C. For embodiments which use a dopant gas other than $O_2$, the doping temperature range may include temperatures above 150° C. and below 90° C.

In addition to exposing the organic semiconductor to elevated temperature, light or other type of electromagnetic radiation may be excluded during such exposure. As used herein, light refers to photons with sufficient energy to induce an excited molecular state of the organic semiconductor molecule. The excited molecule may then react with the dopant gas to produce, e.g., an endoperoxide or other oxygen-related defect when an oxygen-containing dopant gas is used.

In the context of the present discussion, the formation of the endoperoxide or other deep charge trap is considered undesirable. Thus, the method described herein excludes photons capable of producing a molecular excitation that may result in formation of such traps. Photons with a wavelength long enough that only heating, e.g., of the semiconductor occurs are not considered "light" in the present discussion. In some cases, light only includes photons having energy greater than about 3 eV, corresponding to a wavelength of about 400 nm or less. This wavelength range corresponds roughly with ultraviolet and higher energy photons. In other cases, light includes visible photons, e.g., having a wavelength up to about 780 nm. Such cases include those in which visible wavelengths are capable of producing molecular excitations in the organic semiconductor molecule capable of reacting with the dopant gas to produce deep charge traps.

Doping as used herein includes both additive doping and subtractive doping. Additive doping involves increasing the density of charge traps in an organic semiconductor, while subtractive doping involves reducing that density. It is believed that the dopant gas is relatively weakly associated with the organic semiconductor when the organic semiconductor is doped as described here, therefore making the doping reaction at least partially reversible. The utility of this feature is discussed in greater detail below.

When the organic semiconductor is heated in the presence of an ambient including a relatively high partial pressure of oxygen, e.g., the organic semiconductor may be oxidized, and the concentration of oxygen and associated charge traps therein may increase. Conversely, when an organic semiconductor already containing oxygen, e.g., is heated in an ambient including a relatively low partial pressure of oxygen, the concentration of oxygen in the organic semiconductor may be reduced. Thus, the concentration of charge traps associated with the oxygen therein may decrease, resulting in a reduced doping level.

In addition to the specific dopant gas and organic semiconductor used, the doping process may further depend on the pressure of the doping gas and the presence of other gases in the ambient. In an embodiment using $O_2$ as the dopant gas, an oxygen partial pressure of about 50 kPa or greater may be used for additive doping, and a partial pressure of about 10 Pa or less may be used for subtractive doping. As used herein, an ambient with a partial pressure of the doping gas about 10 Pa or less is referred to as a vacuum. In another embodiment, when the doping gas includes, e.g., oxygen, hydrogen in the ambient may act as a reducing agent, facilitating subtractive doping of a previously doped organic semiconductor.

In an embodiment, the organic semiconductor includes rubrene. Rubrene may be formed in crystalline form by, e.g., sublimation from a stream of Ar and/or $H_2$ gas. In a nonlimiting example, the rubrene is heated to about 280-320° C. and the carrier gas is flowed through a horizontal sublimation tube. Rubrene crystals may form spontaneously in a 30 cm zone. A more detailed description of an example process is provided in U.S. patent application Ser. No. 11/159,781 to Kloc, et al., entitled "Purification of Organic Compositions by Sublimation," which is incorporated by reference as if reproduced herein in its entirety. As described in detail below, FETs may be assembled using rubrene crystals formed in this manner with advantageous results.

The inventors believe that the rate of change of semiconducting characteristics of the FET 100 may be limited by the rate of diffusion of the dopant gas into the organic semiconductor and the geometry of the FET 100 formed therewith. For example, for a fixed distance 170, a higher diffusion rate of dopant gas in the channel material 110 will result in a shorter time to achieve desired doping level. Similarly, for a fixed diffusion rate, a shorter distance 170 will result in a shorter time. As discussed further below, the duration of exposure to the dopant gas or vacuum may be limited to result in a desired conductivity of the organic semiconductor.

As described briefly above, in some embodiments the dielectric layer 150 is substantially impermeable to the dopant gas. In such embodiments, the dielectric layer 150, in combination with the substrate 195 when used, substantially prevents diffusion of the dopant gas into and out of the channel material 110. The doping channel 165 is formed to provide a path through the otherwise impermeable barrier formed by the dielectric layer 150 and substrate 195. The dopant gas may diffuse into or out of the dielectric layer 150 through the doping channel 165 and exposed portion 160. When the channel material 110 is doped to a desired level, the doping channel 165 can be sealed by the capping layer 197 or by a package that excludes the dopant gas. The doping channel 165 exposes a small fraction (e.g., about 10% or less) of the surface 115 of the channel material 110, and the channel material 110 is considered substantially encapsulated when this fraction remains small. In some cases, the channel material 110 is substantially encapsulated when at least about 80% of the surface 115 of the channel material 110 is covered with the dielectric layer 150. In other embodiments, about 90% or more of the surface 115 is covered. In yet other embodiments, 99% or more of the surface 115 is covered.

The dielectric thickness 155 may be selected with two considerations in mind. First, the dielectric thickness 155 may be chosen to result in a desired $V_{th}$. Second, the dielectric thickness 155 may be chosen such that the rate of diffusion of the dopant gas through the dielectric layer 150 is low enough to provide stability of the doping level over the lifetime of the FET 100. The minimum thickness necessary to result in a particular diffusion rate will, in general, depend on the material from which the layer is formed, and will typically be inversely related to the permeability of the dopant gas through a unit thickness of the material.

In some embodiments, the diffusion rate of the dopant gas in the channel material 110 is low enough that the channel material 110 need not be substantially encapsulated, or the barrier properties of the dielectric layer 150 may be relaxed. In such cases, sealing the doping channel 165 may also be optional. These embodiments are characterized by the dopant gas having a low enough diffusion rate in the channel material 110 at the operating temperature that changes in doping over the life of the FET 100 may be neglected.

In one aspect, the dielectric layer 150 may be deposited in a manner that does not substantially alter the properties of the channel material 110. In a nonlimiting example, the dielectric layer 150 is a polymer. Polymers may be deposited by, e.g., a spin-on or a chemical vapor deposition (CVD) process. One such polymer formed by CVD is Parylene N, in which oxygen, e.g., may have a permeability of about $1.3E-6 \ \mu m^2 \cdot s^{-1} \cdot Pa^{-1}$ to about $1.8E-6 \ \mu m_2 \cdot s^{-1} \cdot Pa^{-1}$ at about 23° C. Parylene N may be deposited from the vapor phase in a highly conformal, pinhole-free form. A thickness of 3-4 μm of Parylene N is often an effective oxygen barrier at a temperature of about 100° C. or less. Substituted Parylenes such as Parylene-C, D, or HT also have dopant gas permeability values comparable to or lower than Parylene N. Parylenes may be deposited at about room temperature (25° C.), thus minimizing risk of heat-induced changes of the channel region 140.

Figure 4:
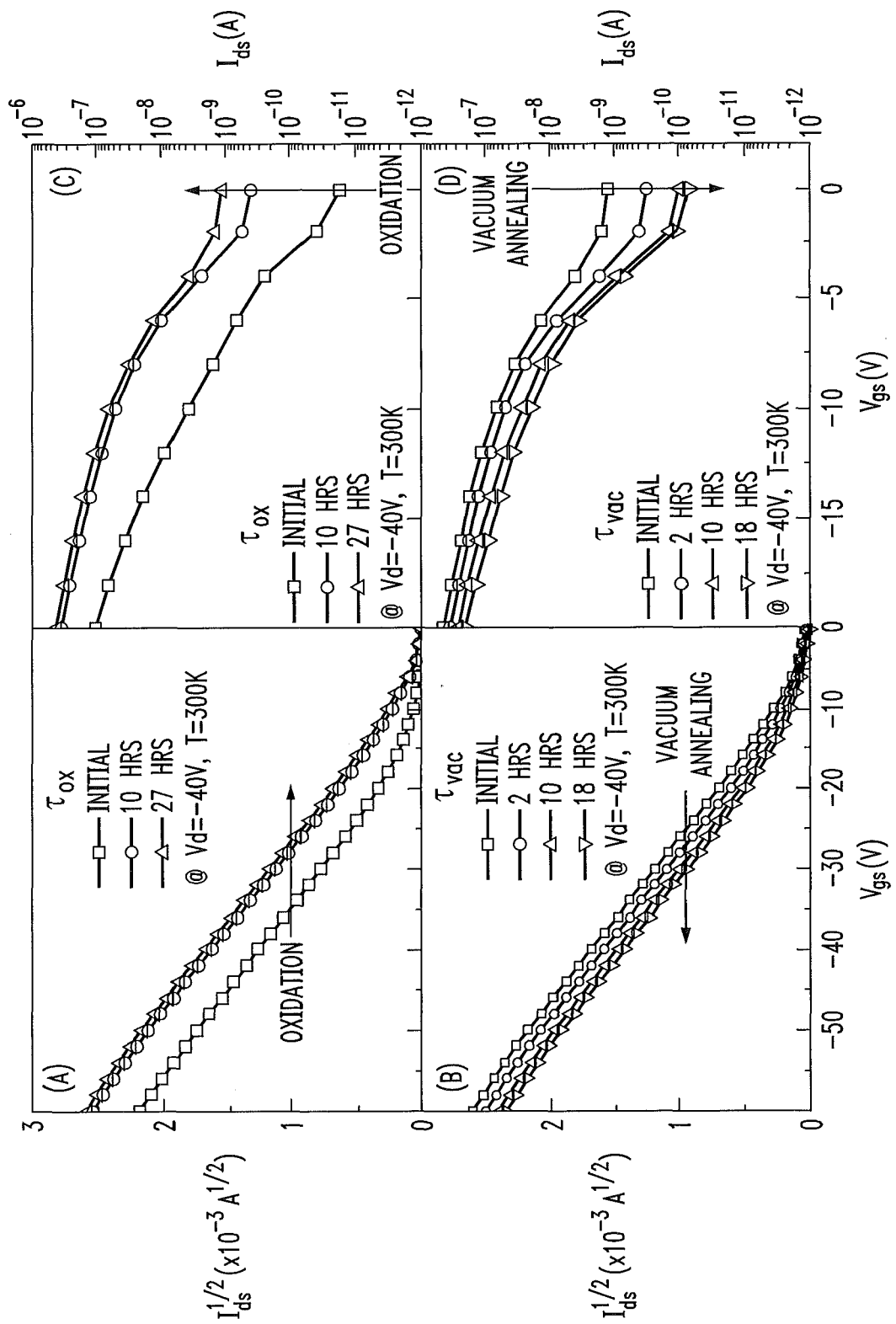
FIGS. 4A-4D and 5A-5B illustrate electrical characteristics of a FET.

FIG. 4 illustrates, without limitation, the relationship between drain-source current $I_{ds}$ and gate-source voltage, $V_{gs}$ of an experimental FET configured as illustrated in FIG. 1A, using rubrene as the channel material 110, parylene as the dielectric layer 150, and $O_2$ as the dopant gas. The distance 170 from the doping channel 165 to the channel region 140 for this device is about 1.6 mm, and the dielectric thickness 155 is about 3.2 μm. Data were obtained at saturation, $V_{ds}=-40$ V, to minimize the effect of contact potentials. Under these conditions, $I_{ds, \ sat} \propto \mu_{eff}(V_{gs}-V_{th})^2$, where $\mu_{eff}$ is the effective mobility of the holes. FIGS. 4A and 4B display $I_{ds}^{1/2}$ as a function of $V_{gs}$. FIGS. 4C and 4D display $\log(I_{ds})$ as a function of $V_{gs}$. FIGS. 4A and 4C are associated with oxidation of the gate dielectric, and FIGS. 4B and 4D are associated with reduction. Further details of this experimental work may be found in Woo-young So, et al., "Mobility-independent doping in crystalline rubrene field-effect transistors," Solid State Communications 483-86 (2007) incorporated herein as if reproduced in its entirety.

Two additive doping (e.g., oxidation) steps are shown in FIG. 4A. The initial $I_{ds}^{1/2}$ versus $V_{gs}$ characteristic is substantially linear below about −20 V, indicating that $\mu_{eff}$ is substantially constant in this range. Doping was done with at a temperature of about 110° C. and an $O_2$ ambient at about 110 kPa that substantially excluded other gases. After 10 h of oxidation, the transfer curve has shifted significantly to the right, indicating that the FET $V_{th}$ is lower, and the conductivity of the channel region 140 is higher. Continuing exposure to $O_2$ and heat for an additional 17 h causes the curve to move further in the same direction, though less so. The 10 h and 27 h curves are shifted without significant change of the slope, indicating that the majority carrier mobility is substantially unchanged after doping.

FIG. 4B shows the effect of subtractive doping (e.g., vacuum annealing) on transport behavior of the experimental FET. Annealing was done at a temperature of about 110° C. with an $O_2$ ambient at about 1.5 Pa. In this case, $I_{ds}^{1/2}$ versus $V_{gs}$ was measured at 2, 10 and 18 hours of annealing. In contrast to additive doping, in each case, the transfer characteristic shifts left, indicating an increase of $V_{th}$ and a decrease of conductivity of the FET. Again, the mobility of the charge carriers is substantially unchanged, as inferred from the substantially unchanged slope during annealing. Moreover, after 18 hours of annealing, the FET is almost restored to the initial state, indicating substantial reversibility of the doping process.

In FIGS. 4C and 4D, the transfer curves are replotted on a logarithmic scale. The off-currents, e.g., $I_{ds}$ taken at $V_{gs}$=0 V, are used to evaluate the equilibrium state of the channel material 110, in this case rubrene. After 27 h of oxidation, the off-current is seen to increase in FIG. 4C by about two orders of magnitude, while the current at $V_{gs}$=−60 V is seen to increase about 40% in FIG. 4A. Conversely, vacuum annealing for 18 h is seen to reduce the off-current by about one order of magnitude FIG. 4D, and is seen to lower the on-current by about 25% in FIG. 4B. It is thought that in the on-state, the current of the FET 100 is governed not only by $V_{gs}$, but also by the materials parameters $\mu_{eff}$, n, and $V_{th}$.

Figure 5B:
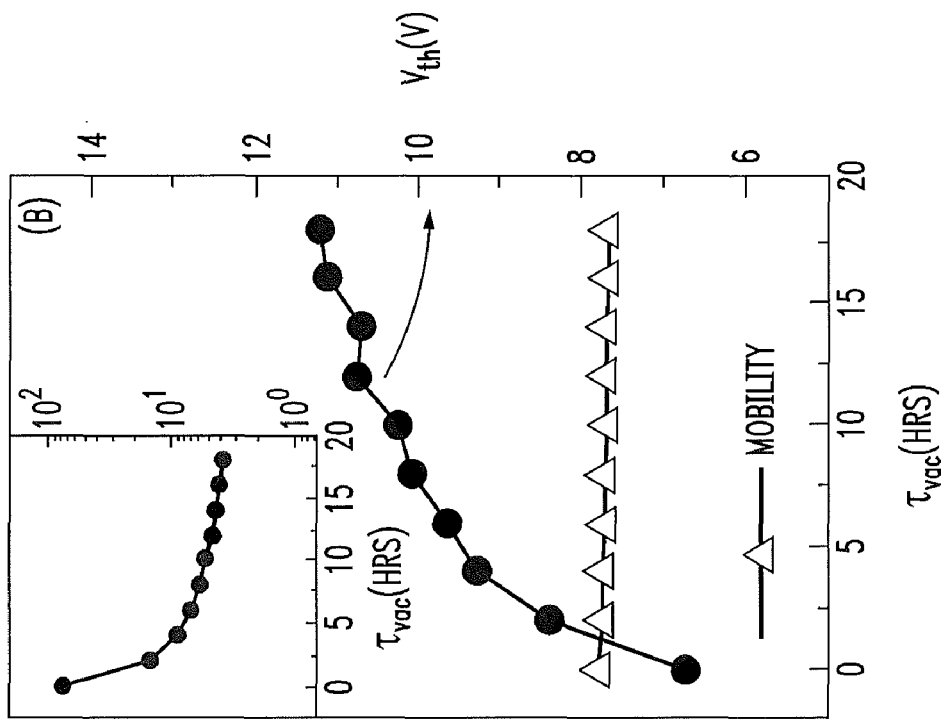
Figure 5A:
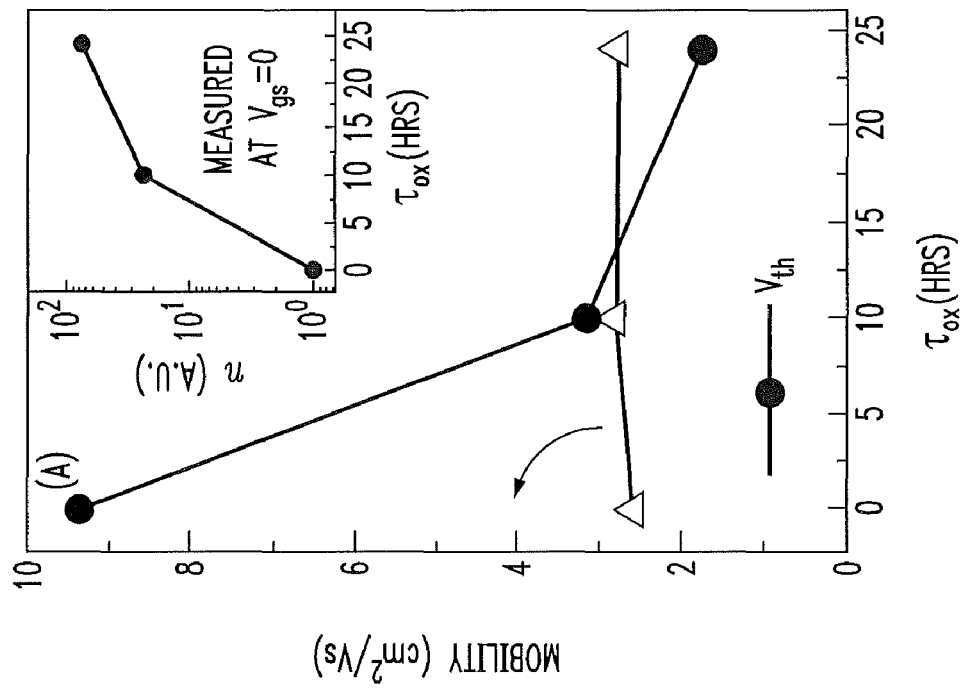

FIGS. 5A and 5B illustrate the mobility $\mu_{eff}$ (left axis), and $V_{th}$ (right axis) of the experimental FET using rubrene as a function of annealing time in $O_2$ (FIG. 5A) and vacuum (FIG. 5B). The conditions of annealing are as described above in this nonlimiting example. The inset to each panel further illustrates the carrier concentration as a function of annealing time. One sees in FIG. 5A that a higher concentration of the dopant species, oxygen in this embodiment, reduces $V_{th}$. This is believed to be attributable to inducing more holes in the valence band. The $\mu_{eff}$ is also seen to remain substantially unchanged. FIG. 5B illustrates that a lower concentration of the dopant species partially restores $V_{th}$ by removing some of the added holes while id, again remains substantially unchanged. It is believed that the substantially stable nature of $\mu_{eff}$ exhibited by the holes in this example illustrates that the transport mechanism of the channel material 110 is substantially unaffected by the additive and subtractive doping processes.

The conductivity σ of the channel region 140 may be determined from current characteristics in FIG. 4 and knowledge of the geometry of the channel region 140. The observed insensitivity of $\mu_{eff}$ with increased α implies that the carrier density, n=σ/μ, increases with additive doping, as shown in the inset to FIG. 5A. In this case, the data were obtained from $I_{ds}$ at $V_{gs}$=0 V. The doping effect is thus analogous to p-type doping in FETs of inorganic semiconductors where a similar decrease of threshold voltage with increased dopant density leaves $\mu_{eff}$ unchanged. This is consistent with the reported increase of conductivity in rubrene on exposure to oxygen. See, e.g. V. Podzorov, et al., Appl. Phys. Lett. 85 (24)(2004) 6039, in which a light-mediated doping reaction was used. The shift of $V_{th}$ bears superficial similarity to that observed by V. Podzorov et al., Phys. Rev. Lett. 93 (8) (2004) 086602, wherein $V_{th}$ was found to increase upon exposure to x-rays. In the latter Podzorov work, however, the shift was associated with creation of deep-level traps, not with a known dopant species as in the illustrated embodiment.

Figure 6A:
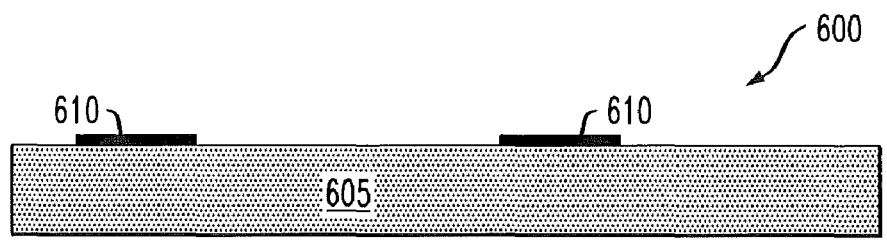
FIGS. 6A-6F illustrate an embodiment of a method of forming a FET.

Turning to FIGS. 6A-6F, illustrated is a method of forming a FET 600. In FIG. 6A, an organic semiconductor 605 is shown with source/drain electrodes 610 formed thereover. In another embodiment, not shown, the organic semiconductor 605 is formed over the source/drain electrodes 610. In a nonlimiting example, the organic semiconductor 605 is a rubrene crystal formed by the method described previously. The source/drain electrodes 610 may be formed thereover by, e.g., conductive paint or physical vapor deposition through a shadow mask. The illustrated embodiment shows without limitation a free-standing crystal of the organic semiconductor 605 without a supporting substrate. In other embodiments, not shown, the organic semiconductor 605 may be placed on a substrate. The substrate may include other resistive or semiconductor devices, and may be e.g., an inorganic semiconductor substrate or a flexible organic substrate.

Figure 6B:
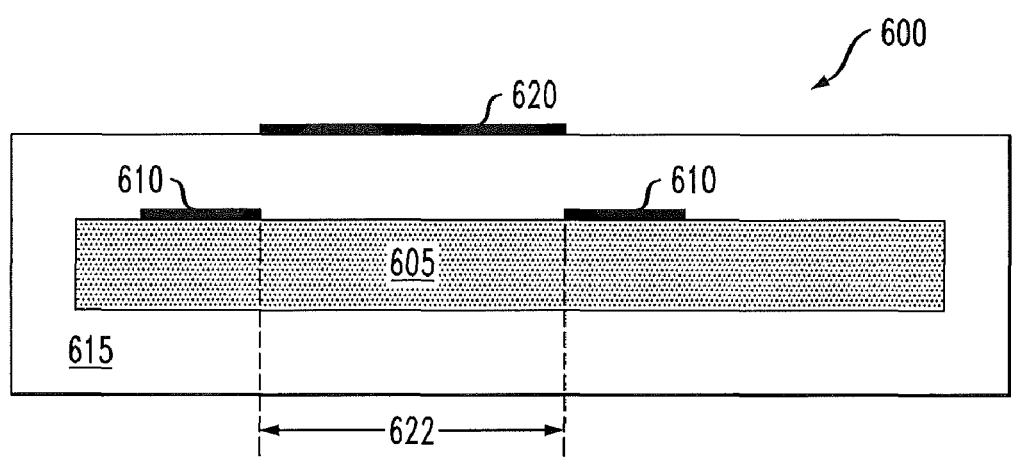

FIG. 6B illustrates the FET 600 after formation of a dielectric layer 615 is formed over the source/drain electrodes 610. The dielectric layer 615 encapsulates the organic semiconductor 605 and the source/drain electrodes 610. As described previously, the dielectric layer 615 may be, in one aspect, substantially impermeable at the deposited thickness to the dopant gas to be used. In some cases, the dielectric layer 615 is parylene or a substituted parylene. Connections to the source/drain electrodes 610 may be made before or after the dielectric layer 615 is formed. If the connections are made afterward, openings (not shown) in the dielectric layer 615 may be formed in a manner that does not expose the organic semiconductor 605 to the ambient, such as, e.g., mask and plasma etch. In this embodiment, it is preferred that the source/drain electrodes 610 are formed of a conductive layer impermeable to the intended dopant gas, such as a metal layer.

Also illustrated in FIG. 6B is a gate electrode 620 formed over the dielectric layer 615. As for the source/drain electrodes 610, the gate electrode 620 may comprise a conductive paint or a metal layer. The gate electrode 620 is positioned to produce a channel region (such as the channel region 140, e.g.) that connects the source/drain electrodes 610 when the FET 600 is operated. In some cases, a preferred configuration of the FET 600 has the gate electrode 620 at least coextensive with a space 622 between the source/drain electrodes 610.

Figure 6C:
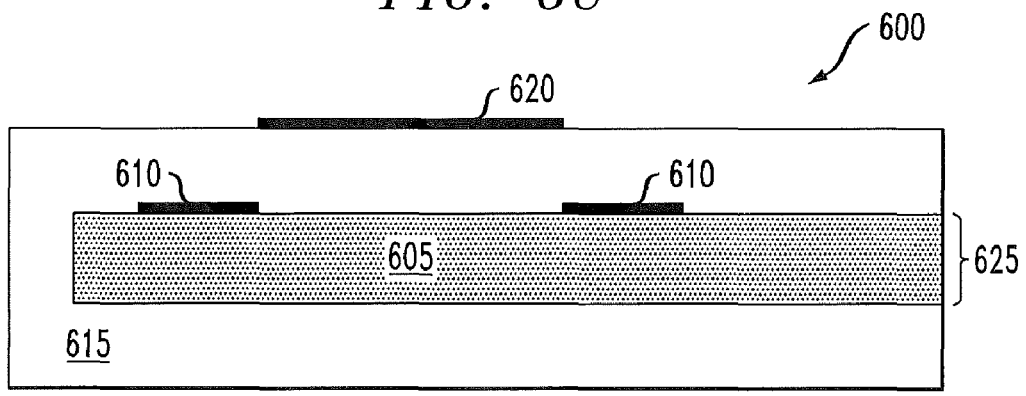

FIG. 6C illustrates the FET 600 after a doping channel 625 is formed in the dielectric layer 615. In one embodiment, such as that illustrated in FIG. 1A, the organic semiconductor 605 may be cleaved and thereby exposed to the ambient. In other embodiments, such as those illustrated by FIGS. 1B and 1C, the doping channel 625 may be formed by, e.g., a plasma etch process to remove a portion of the dielectric layer 615. The doping channel 625 formed thereby may be located in any desired position relative to the source/drain electrodes 610. In some embodiments, the doping channel 625 is located to minimize the required duration of an additive or subtractive doping process in a later step. In other embodiments, the doping channel 625 is formed before the gate electrode 620 is formed.

Figure 6D:
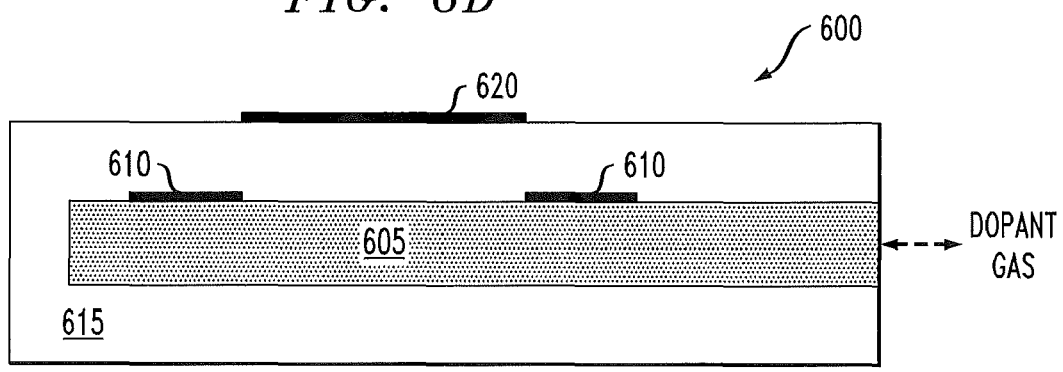

In FIG. 6D, the FET 600 is subjected to a doping process 630. The doping process 630 may include an additive doping process, a subtractive doping process, or both. In some cases, the additive and subtractive doping processes are an oxidation process and reduction process, respectively, as previously described. In some embodiments, the doping process 630 is performed before the FET 600 is connected to other electrical components. In other embodiments, discussed further below, the FET 600 is connected to other components before performing the doping process 630. In a nonlimiting example, the organic semiconductor 605 is additively doped by heating to about 380 K (107° C.) in an $O_2$ ambient at about 110 kPa. In another example, the organic semiconductor 605 is subtractively doped by heating to about 380 K in an ambient of about 10 Pa of the dopant gas or less.

Figure 6E:
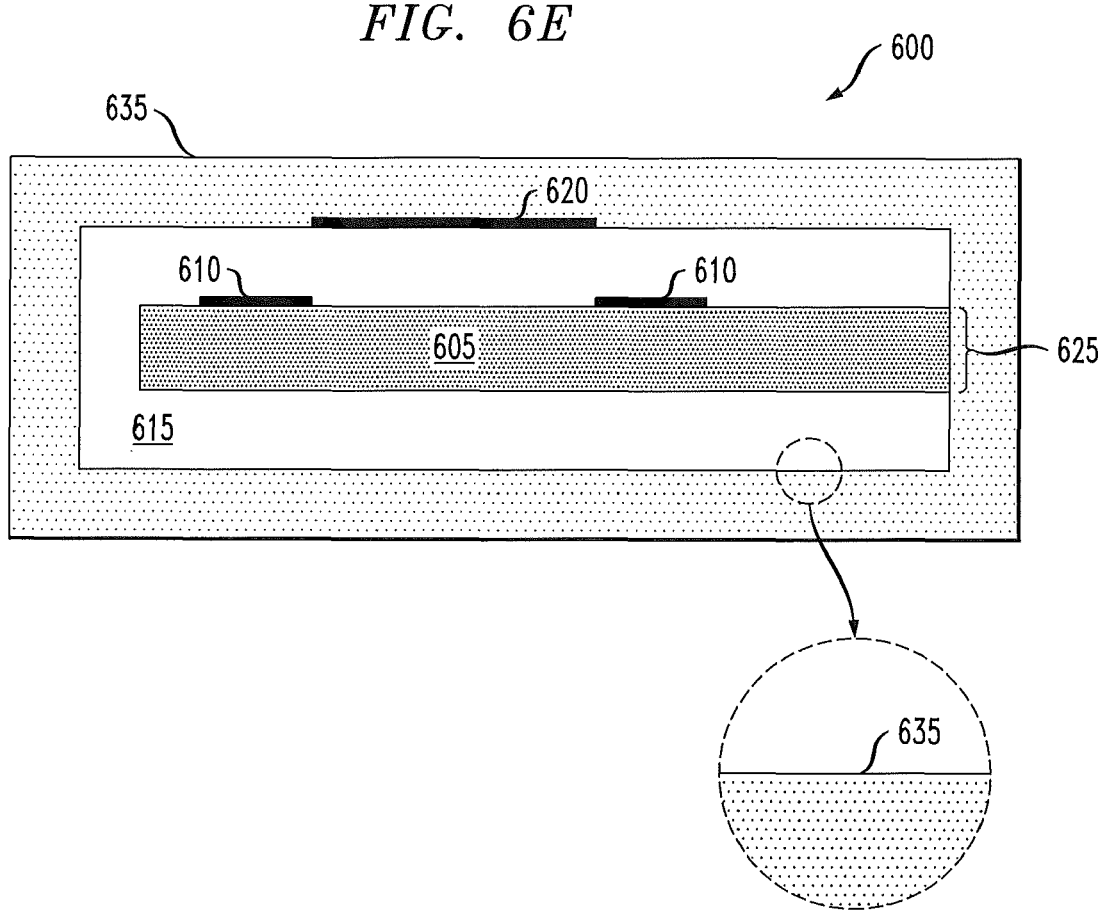

FIG. 6E illustrates the FET 600 after a first capping layer 635 is formed over the gate electrode 620. In the illustrated embodiment, the first capping layer 635 may be, e.g., a dielectric layer that is substantially impermeable to the dopant gas. In this case, the first capping layer 635 serves to seal the doping channel 625 to substantially prevent the diffusion of the dopant gas into or out of the organic semiconductor 605. In some embodiments, the first capping layer 635 is formed from the same material as the gate dielectric layer 615. In such cases, an interface 636 may typically be detected by electron microscopy.

Figure 6F:
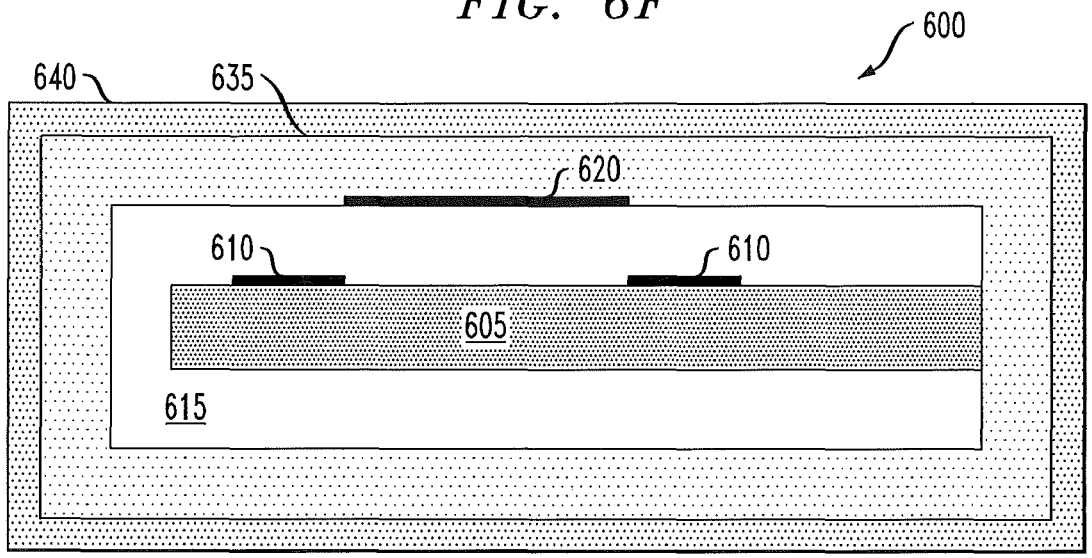

FIG. 6F illustrates the FET 600 after an optional second capping layer 640 is formed over the first capping layer 635. The second capping layer 640 may be substantially opaque to ultraviolet (UV) or longer wavelength light to prevent such light from illuminating the organic semiconductor 605. This result may be desirable where illumination of the doped organic semiconductor 605 by such light causes dopant gas atoms to become disassociated with the organic semiconductor 605, thus changing the conducting properties thereof. The light is substantially blocked when an insufficient fraction of the light reaches the organic semiconductor 605 to cause a change of doping of the organic semiconductor 605 over an operational lifetime. Substantially opaque means that the second capping layer 640 transmits less than about 5% of incident light. In other cases, the transmission may be less that 1% or 0.1%. In one example, the second capping layer 640 may be a metal or plastic portion of a package containing the FET 600, or may be an epoxy resin. In another example, the second capping layer 640 is a dielectric mirror, comprising multiple dielectric layers designed to result in reflection of a substantial portion of the light. In another example, functional aspects of the first capping layer 635 and the second capping layer 640 may be combined in a single material layer that blocks both oxygen and light.

Figure 7:
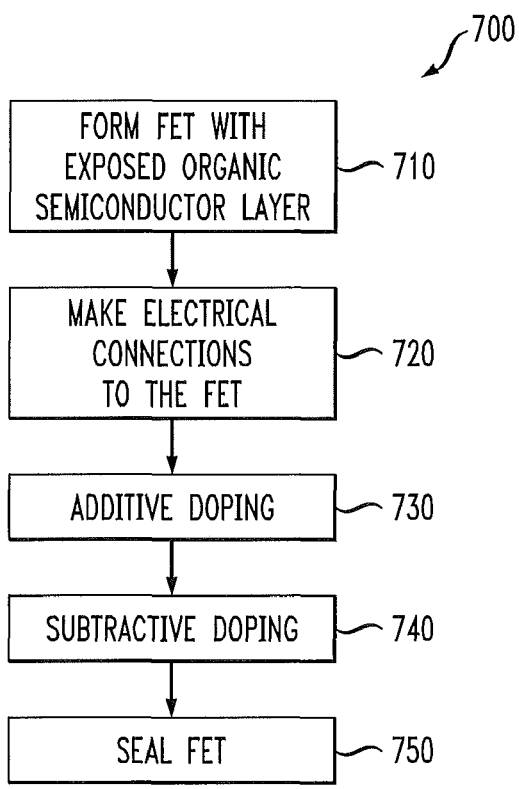
FIG. 7 illustrates an embodiment of a method of doping a FET.

Turning to FIG. 7, illustrated is a flow diagram of a method 700 for adjusting a doping level of a FET such as the FET 600. In a step 710, the FET 600 is formed up to the point that the source, drain and gate electrodes are formed, and a doping channel is formed in the gate dielectric layer. (See FIG. 6C, e.g.) In a step 720, electrical connections to the FET 600 are made so that the FET 600 may be operated in the manner anticipated by the intended application.

In a step 730 and a step 740, the doping level of the FET 600 is configured in a process referred to herein as "trimming". The trimming process is analogous to trimming of resistors in certain electronics applications. In step 730 the FET 600 is additively doped, while operating, as previously described to set a desired doping level of the FET 600. If the operating characteristic of the FET 600 is not within a desired range, the FET 600 may be further additively doped or subtractively doped in step 740 to achieve the desired operating characteristic. In some cases, trimming may include operating the FET 600 in the manner anticipated by the intended application. In some cases, this may include operating the FET 600 in an electrical test system (a "test bed") operated exclusively for the purpose of determining the doping level. In a nonlimiting example, the test bed may include an oscillating circuit with an operating frequency depending on the doping level of the channel region 140. In other cases, the operation may be in the actual circuit the FET 600 is to be operated in after establishing the doping level. In such cases, the doping level may be trimmed until the circuit operates within a design value range. Of course, other methods of trimming the FET 600 may be used as appropriate to the application.

Trimming of the doping level provides an advantageous means of adjusting transistor characteristics in a device or system where, e.g., it is not convenient or feasible to fabricate the transistor with characteristics within a required operating range. For example, physical dimensions typically are uncertain within a tolerance range. It is generally more expensive to produce devices with a tighter tolerance than those with a looser tolerance. The trimming process provides the means to manufacture with a looser tolerance at lower cost, and then adjust the performance of specific transistors whose performance causes the device or system to operate outside a desired operating range. Also, regardless of the tolerance range, a manufacturing process may occasionally produce statistical outliers with performance outside the tolerance range. The trimming process provides for the adjustment of some outliers, allowing for the recovery of devices or systems that might otherwise be discarded.

Heating of the FET 600 may in some cases be done by any means compatible with the operation of the test system or the final circuit, such as, e.g., a heated chamber. In other cases, the heating may be done by a source of spatially confined energy. As used herein, energy is spatially confined when it causes heating of all or a portion of the FET 600 when projected thereon, but does not significantly heat circuit components neighboring the FET 600, e.g., a distance about the same as the dimensions of the FET 600. In some cases, the heated area is smaller than the FET 600. In other cases, the diameter of a region heated by the spatially confined energy source is about the length of the space 622 of the FET 600. Nonlimiting examples of sources of spatially confined energy include lasers and focused incoherent light. Lasers are commercially available with a spot size on the order of one micron, providing the means to heat only a portion of the FET 600 when the device size is greater than 1 micron. When such a spot size is less than a feature size, e.g., the space 622, the spot may be scanned to heat the entire feature. Moreover, the wavelength of the light may be chosen in relation to the size of features to be heated to help limit the spatial extent of heating. In some cases, the wavelength may also be limited to avoid producing molecular excitations in the organic semiconductor 605, as previously described.

The spot size, power density, wavelength and illumination time of the spatially confined energy source may be chosen to result in a desired temperature of a particular FET 600 without causing chemical decomposition of the organic semiconductor 605. In some embodiments, the beam size and power are selected so that only one FET of a plurality of FETs in a circuit is trimmed at a time. In other embodiments, multiple FETS are trimmed simultaneously. After the trimming operation is completed in steps 720, 730, the FET 600 may be sealed with one or more capping layers, or packaged, to exclude a doping gas and/or light in a step 750.

Although the present invention has been described in detail, those skilled in the art should understand that they can make various changes, substitutions and alterations herein without departing from the spirit and scope of the invention in its broadest form.

What is claimed is:

1. A method, comprising:
   forming a contiguous semiconducting region that includes polyaromatic molecules; and
   heating said region to a temperature above room temperature in the presence of a dopant gas in an absence of light having visible and shorter wavelengths to form a doped organic semiconducting region.

2. The method of claim 1, further comprising forming a barrier to said dopant gas over said semiconducting region.

3. The method of claim 1, wherein said dopant gas includes oxygen.

4. The method of claim 1, further comprising forming a barrier that substantially prevents exposure of said semiconducting region to said dopant gas after said heating.

5. The method of claim 4, wherein said barrier blocks light from illuminating said region.

6. The method of claim 4, wherein said barrier includes a dielectric layer substantially impermeable to said dopant gas.

7. The method of claim 1, further comprising forming a source and drain electrode on a surface of said organic semiconducting region and a gate electrode on a surface of said dielectric layer, thereby forming a FET transistor.

8. The method of claim 7, further comprising setting a threshold voltage of said FET transistor to a predetermined level after forming said electrodes.

9. The method of claim 8, wherein said threshold voltage is set by heating said polyaromatic molecules with a source of spatially confined energy.

10. The method of claim 8, wherein said threshold voltage is set while operating said FET transistor.

11. The method of claim 1, wherein a mobility of majority charge carriers in said semiconducting region changes by about 10% or less after doping said semiconducting region.

12. The method of claim 1, wherein molecules of said region are selected from the group consisting of acenes and thiophenes.

13. The method of claim 12, wherein said polyaromatic molecules comprises rubrene.

14. A method, comprising:
   forming an organic semiconducting region that includes a crystalline region of polyaromatic molecules;
   forming a dielectric layer over said organic semiconducting region;
   forming an opening in said dielectric layer to expose said organic semiconducting region; and
   then heating said crystalline region to a temperature above room temperature in the absence of light having visible and shorter wavelengths.

15. The method of claim 14, wherein said heating includes exposing said crystalline region to a dopant gas comprising oxygen during said heating.

16. The method of claim 14, wherein said heating includes exposing said crystalline region to an ambient with an oxygen partial pressure of about 10 Pa or less during said heating.

17. The method of claim 14, wherein said heating includes heating said crystalline region to a temperature ranging from about 90° C. to about 150° C.

* * * * *